(12) United States Patent
Kunihara et al.

(10) Patent No.: US 6,784,511 B1
(45) Date of Patent: *Aug. 31, 2004

(54) RESIN-SEALED LASER DIODE DEVICE

(75) Inventors: Kenji Kunihara, Kawasaki (JP); Yoichi Shindo, Kawasaki (JP); Hiromi Mojikawa, Kawasaki (JP); Tadashi Umegaki, Kawasaki (JP); Satoru Nagano, Kawasaki (JP)

(73) Assignee: Fuji Electric Co., Ltd., Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 08/317,818

(22) Filed: Oct. 4, 1994

(30) Foreign Application Priority Data

Jan. 20, 1994 (JP) .............................................. 6-004305
Apr. 4, 1994 (JP) .............................................. 6-065810

(51) Int. Cl.⁷ ......................................... H01L 31/0232
(52) U.S. Cl. ........................ 257/433; 257/432; 257/431
(58) Field of Search ................................. 257/433, 436, 257/437, 432, 431, 452

(56) References Cited

U.S. PATENT DOCUMENTS

| | | |
|---|---|---|
| 5,140,384 A | 8/1992 | Tanaka |
| 5,226,052 A | 7/1993 | Tanaka |
| 5,355,385 A * | 10/1994 | Amano et al. .............. 372/419 |

FOREIGN PATENT DOCUMENTS

| | | |
|---|---|---|
| EP | 0 366 472 A2 | 5/1990 |
| EP | 0 484 887 A2 | 5/1992 |
| EP | 0484887 * | 5/1992 |
| JP | 60-217687 | 10/1985 |
| JP | 2-125687 | 5/1990 |
| JP | 2-125688 | 5/1990 |
| JP | 5-3377 | 1/1993 |
| JP | 5160521 | 6/1993 |
| JP | 5-160521 | 6/1993 |

* cited by examiner

Primary Examiner—Sheila V. Clark
(74) Attorney, Agent, or Firm—Finnegan, Henderson, Farabow, Garrett & Dunner, L.L.P.

(57) ABSTRACT

In a resin-sealed laser diode device, in order to prevent the sealing resin on the front light-emitting end face of the laser diode chip from being deteriorated by the laser beam, a thermosetting rubber-like organic silicone resin layer is formed on the front light-emitting end face to a thickness of at least 50 $\mu$m on the extension of the surface of the active layer. On the side of the rear light-emitting end-face of the laser diode chip, the rubber-like organic silicone resin layer on the photo-diode is curved upwardly with respect to the light receiving surface of the latter. Furthermore, in order to prevent the far field pattern of the laser beam from being made irregular, at least the surface of the end-face protecting film on the light-emitting end face essentially contains silicon dioxide.

8 Claims, 13 Drawing Sheets

RESIN-SEALED LASER DIODE DEVICE

BACKGROUND OF THE INVENTION

The present invention relates to a laser diode device which is formed by sealing a laser diode chip with resin, and more particularly to an improvement of the laser diode device so that its sealing resin is prevented from being damaged by the laser beam from the laser diode chip, and the far field pattern thereof is satisfactory at all times.

A conventional laser diode device is, in general, of a can type as shown in FIG. 9. That is, a laser diode chip 10 is soldered to a radiator 62 mounted on a stem 61, and a cap 63 with a glass window is welded to the stem to seal the laser diode chip 10.

On the other hand, resin type light emitting elements have been employed in the light emitting elements low in optical density per unitary area such as light emitting diodes (LED), and resin-sealed laser diodes also have been known in order to make the laser diodes low in manufacturing cost and shaped with greater freedom. However, in sealing a light emitting element such as a laser diode high in optical density with resin, a problem is still involved which has not sufficiently solved yet. The problem is that the sealing resin is damaged by the laser beam, and the resultant light emitting element is therefore low in reliability or short in life time.

For instance, when a life test was given to a resin-sealed laser diode, which was sealed with a transparent epoxy resin high in optical transmission, under automatic power control (APC) for an ambient temperature of 60° C. and an optical output of 3 mW, the sealing resin in contact with the laser beam emergence section (about 5 $\mu$m×1 $\mu$m) of the laser diode was optically damaged within 100 hours; that is, holes were formed in the portions of the sealing resin which corresponded in position to the laser beam emergence section, thus lowering the characteristics of the laser diode.

On the other hand, it has been found that the above-described deterioration in characteristic of the laser diode can be effectively prevented by formation of an end-face breakage preventing layer between the laser diode chip and the sealing resin by using a material which is low in absorption coefficient with the band of wavelengths of the laser beam and high in heat resistance. The method has been filed with the Patent Office (U.S. Ser. No. 07/788,601 assigned to the same assignee as this application). The material of the end-face breakage preventing layer may be non-organic materials such as alumina, silica and low melting point glass, or organic materials such as silicone resin. For more information, see Japanese Patent Unexamined Publication No. Hei. 5-3377.

One example of the above-described resin-sealed laser diode device is as shown in FIG. 1, a perspective view. FIG. 2 is also a perspective view, with parts cut away, of a laser diode chip 10 shown in FIG. 1. FIG. 3 is a sectional view of the laser diode chip, taken along the longitudinal axis of an electrode 7.

The laser diode chip 10 is formed as follows: An n-type clad layer 3 of AlGaAs, an active layer 4, a p-type cladding layer 5, and p-type cap layer 6 of GaAs are formed on an n-type substrate 2 of GaAs in the state order. An electrode 7 is formed on the p-type cap layer 6, and another electrode 8 is formed on the substrate 2. In order to allow current to concentrate at the center of the active layer 4, the p-type cladding layer 5 has a current narrowing portion (not shown). The surfaces of light emitting end-faces 9 are coated with an insulating dielectric thin film, namely, an end-face protecting film 20b to a thickness of 0.5 $\mu$m or less. In the chip 10, the light-emitting end faces have a laser beam emergence section about 5 $\mu$m×1 $\mu$m. In addition, end-face breakage preventing layers 20, which are low in absorption coefficient to the band of wavelengths of the laser beam and high in heat resistance, are formed on the end-face protecting film 20b which is formed on the light emitting end faces 9 including the laser beam emergence sections. As shown in FIG. 4, a sectional view of a resin-sealed laser diode different in external configuration from the one shown in FIG. 1, the laser diode chip 10 with the end-face breakage preventing layers 20 is mounted on a heat radiating board 71 supported by a lead frame 72, and then sealed with a sealing resin 30 such as transparent epoxy resin so that the resin-sealed laser diode is formed.

The heat radiating board 71 is made of a Si substrate. A photo-diode 73 (see FIG. 1) is formed on a part of the upper surface of the heat radiating board 71. Its light receiving surface is in parallel with the above-described layers 2 through 6 and electrodes 7 and 8 of the chip 10, thus being able to monitor an emergent laser beam 101b (see FIG. 4) from the back side of the chip 10. The laser beam 101 emergent from the emergence section about 5 $\mu$m×1 $\mu$m forms a divergent angle; i.e., a horizontal angle of about 10° and a vertical angle of about 40° in the half width of the laser beam intensity distribution. Accordingly, the beam area 102 (see FIG. 2) increases substantially in proportion to the square of the distance m which the laser beam 101 travels, whereas the optical density decreases substantially in proportion to the square of the distance m.

On the other hand, in the case where the light emitting end face of a laser diode chip high in optical density is covered with the end-face breakage preventing layer, as shown in FIG. 5 (which is an enlarged sectional view of the laser beam emergence section of the laser diode chip), the optical density of the laser beam 101 advancing towards the surface 20a of the end-face breakage preventing layer from the light emitting end face 9 is decreased at the surface 20a in proportion to the square of the thickness of the end-face breakage preventing layer 20.

Intensive research has been conducted with the above-described facts taken into consideration. During the research, it has been found that the thickness of the end-face breakage preventing layer 20 necessary for sufficiently reducing the optical intensity of the laser beam, and the life time of the resin-sealed laser diode are closely related to each other. This end-face breakage preventing layer, being greatly related to the present invention, will be described in more detail.

The material most suitable for formation of the end-face breakage preventing layer is silicone resin.

FIGS. 6(a) to 6(e) show a process of manufacturing a laser diode whose end-face breakage preventing layer is formed by using the silicone resin. First, a laser diode chip 10 having end-face protecting films 20b of Al$_2$O$_3$ on the light-emitting end faces is soldered, as indicated at 74, to a heat radiating board 71 of Si by a junction down method in such a manner that the chip 10 is adjacent to the light receiving surface 73a of a photo-diode 73 formed on the heat radiating board 71, and the light emitting end face of the chip 10 is flush with the side end face of the heat radiating board 71 (FIG. 6(a)). Next, the heat radiating board 71, on which the chip 10 has been fixedly mounted, is fixedly mounted in place on a lead frame 72 with an Ag epoxy adhesive 75 (FIG. 6(b)). Under this condition, the chip 10, the photo-diode 73, and external lead electrode terminals 721 and 722 of the lead frame 71 are connected by wire bonding (FIG. 6(c)). Thereafter, a dispenser (not shown) is used to apply a suitable amount of silicone resin to the chip 10 from obliquely above. The silicone resin thus applied is heated and hardened to form an end-face breakage preventing layer 20 (FIG. 6(d)). The resultant product is sealed with an epoxy resin 30, which transmits laser beam, to a predetermined configuration (FIG. 6(e)). Thus, the aimed laser diode has been manufactured. The laser diode is high in the flexibility of configuration. It may have the same configuration as the can type laser diode shown in FIG. 4. The laser diode shown in FIG. 6(e) is of a flat type which is high in productivity and in applicability to a variety of devices.

A laser diode having an end-face breakage preventing layer of dimethyl polysiloxane as the above-described one 20 was formed, and the relationships between its thickness and the life time were investigated. As a result of the investigation, the life time was ranged from 3800 hours to 12000 hours with a thickness of 20 to 30 $\mu$m. The term "life time" as used herein is intended to mean the time which elapses until the sealing resin is optically damaged, so that the optical output of the laser diode is changed. Owing to the provision of the end-face breakage preventing layer, the life time of the resin-sealed laser diode is markedly increased, and its performance may be equivalent to that of the can type laser diode.

In addition, it has been found that, in 20 to 30% of the light emitting elements, the monitor current (Im) of the photo-diode adapted to receive the emergent laser beam at the back of the laser diode is greatly increased when the latter provides a predetermined optical output. The monitor current (Im) is used for controlling the laser beam emitted forwardly from the laser diode, and therefore it should not be greatly varied. Thus, those elements are determined unacceptable. Research has been conducted on the reason why the unacceptable elements having such large variation are formed, and found the following fact: As shown in a sectional view of FIG. 7, interfacial separations 80a are always formed between the silicone resin 20 on the photo-diode 73 formed in the heat radiating board 71 and the sealing resin 30 because of an interfacial stress which is caused by the difference in thermal expansion coefficient between them. And a part of the laser beam 101 applied to the interfacial separation 80a is reflected thereby as indicated at 101c, so that, in this case, the amount of laser beam applied to the photo-diode 73 is larger as much when compared with the case where no interfacial separation 80b is formed.

In order to promote the adhesion of the silicone resin, which is the material of the end-face breakage preventing layer, to the sealing resin thereby to prevent the separation of those resins as much as possible, a method has been proposed in which high-energy rays such as ultra-violet rays are applied to the surface of the silicone resin (see Japanese Patent Unexamined Publication No. Hei. 5-160521). The method is considerably effective in preventing the formation of the interfacial separations on the side of the front light-emitting end face, but on the side of the rear light-emitting end face it is not so effective, and the aforementioned unsatisfactory change in monitor current (Im) is not decreased so much.

The interfacial separation may be eliminated by making the thermal expansion coefficient of the end-face breakage preventing layer equal to that of the sealing resin or by using the same material for the end-face breakage preventing layer and the sealing resin. However, no appropriate combinations of those resins have been found yet.

In addition, in view of the present manufacturing technique, it is considerably difficult to form the end-face breakage preventing layers of silicone resin of a desired film thickness to cover only the front and rear light-emitting end faces.

The laser diodes subjected to the aforementioned life test were examined for electrical and optical characteristics during the test. As a result, it was found that about 1% of the laser diodes were unacceptable because the far field pattern (FFP) of the emergent laser beam was greatly irregular. In addition, a cyclical heat test was given to the laser diodes, one cycle comprising (1) a step of allowing the laser diode to stand at 85° C. for thirty minutes, (2) a step of quickly cooling the laser diode to −40° C. and allowing it to stand for thirty minutes, and (3) a step of quickly heating the laser diode to 85° C. As a result, it was found that, when the number of cycles reached 200, the aforementioned unwanted phenomenon occurred frequently.

The cause for the occurrence of the unwanted phenomenon was investigated, and the following fact was found: As shown in FIGS. 16(a) and 16(b), separations 50 were formed at the interface between the end-face protecting film 20b of insulating dielectric such as $Al_2O_3$ coated on the light emitting end face, and a rubber-like organic silicone resin which is the material of the end-face breakage preventing layer 20. In the unacceptable light emitting elements, at least some of the separations 50 were located over the laser beam emergence section 51. On the other hand, in the acceptable light emitting elements, the separations were formed in the same manner; however, they were not located over the laser beam emergence section 51.

That is, it can be considered that the laser beam was scattered when passing through the separation formed between the end-face protecting film 20b of insulating dielectric and the end-face breakage preventing layer 20 of rubber-like organic silicone resin at the laser beam passing portion of the laser beam emergence section 51, thus making the far field pattern (FFP) irregular. The formation of the separations is due to the difference in thermal expansion coefficient between the laser diode chip 10 and the rubber-like silicone resin 20. This difference causes the end-face protecting film 20b and the end-face breakage preventing layer 20 to separate from each other.

In order to promote the adhesion of the end-face protecting film 20b to the end-face breakage preventing layer 20 thereby to prevent the separation of the film 20b and the layer 20 from each other, a method has been proposed in which high-energy rays such as ultra-violet rays are applied to the surface of the end-face protecting film 20b, and then rubber-like silicone resin is applied to the film thus treated. However, it is difficult for the method to completely solve the above-described problem.

SUMMARY OF THE INVENTION

In view of the above described problems, an object of the present invention is to provide a resin-sealed laser diode device in which separation between the end-face protecting film and the end-face breakage preventing layer of the laser diode chip is prevented, and separation between the end-face breakage preventing layer and the sealing resin is prevented, so that the far field pattern is not made irregular, the laser beam monitoring photo-diode is not varied in monitor current (Im), and the diode has a long lifetime.

The foregoing object of the present invention has been achieved by the provision of a resin-sealed laser diode device comprising: a laser diode chip having front and rear light-emitting end faces through which a laser beam from an active layer are emitted forwardly and backwardly; a lead frame supporting the chip through a supporting substrate; a sealing resin sealingly isolating the chip from the outside air; an end-face breakage preventing film of organic silicone resin low in the absorption coefficient to the band of wavelengths of the laser beam, for preventing the sealing resin near the light-emitting end faces from being damaged by the laser beam; and end-face protecting films made of an insulating dielectric coating the light-emitting end faces; wherein the end-face protecting films essentially contain silicon dioxide in its contact surface with the organic silicone resin, the organic silicone resin essentially contains rubber-like dimethyl polysiloxane, the rubber-like-organic silicone resin is a thermosetting resin, the end-face breakage preventing layer has a thickness of at least 50 μm on the side of the front light-emitting end face on the extension of the surface of the active layer of the chip, the supporting substrate of the laser diode chip has the light receiving surface of a photo-diode which is in parallel with the surface of the active layer of the laser diode chip and monitors a laser beam emitted through the rear light-emitting end face, the laser diode chip is fixedly mounted on the lead frame with the front light-emitting end face held flush with the end face of the supporting substrate, the laser diode chip is fixedly mounted on the lead frame being shifted inwardly from the end of the lead frame to the extent that a laser beam emitted through the front light-emitting end face of the chip is not substantially blocked by the lead frame, and the position of the laser diode chip fixedly mounted on the lead frame is defined by the following expression: 0<X<L cot ($\theta_v$/2) where X is the distance between the laser diode chip and the end of the lead frame, L is the distance between the lead frame and the active layer, and $\theta_v$ is the full width angle at half maximum, in the vertical emission direction, of the laser beam.

In the device of the present invention, the surface of the end-face protecting film is coated with silicon dioxide to increase the strength of adhesion of the end-face protecting film to the end-face breakage preventing layer, thus preventing the interfacial separation. This eliminates the difficulty that the laser beam is scattered by the separations formed in the interface between the end-face protecting film and the end-face breakage preventing layer, thus making the far field pattern unacceptable. Furthermore, in the device, the end-face breakage preventing layer is formed by using thermosetting rubber-like silicone resin with a thickness of at least 50 μm on the side of the front light-emitting end-face of the laser diode chip. Hence, the difference in thermal expansion coefficient between the end-face breakage preventing layer and the sealing resin can be absorbed by the expansion and contraction of the end-face breakage preventing layer, which prevents the occurrence of interfacial separation between the end-face breakage preventing layer and the sealing resin. Moreover, in the device, the end-face breakage preventing layer is large in thickness, and the optical damage to the sealing resin is therefore decreased as much, which increases the service life of the device. The laser diode chip has a stress-relieving structure which is provided by making the end-face breakage preventing layer large in thickness. In addition, the silicone resin layer on the side of the photo-diode is so shaped that its surface is curved upwardly with respect to the light receiving surface of the photo-diode. As a result, the stress induced in the interface between the end-face breakage preventing layer and the sealing resin by the difference in thermal expansion coefficient between them is concentrated into a region through which the laser beam does not pass. In other words, even in the case where the interfacial separation occurs partially because the stress is too large to be absorbed by the expansion and contraction of the rubber-like silicone resin, the interfacial separation can be limited in position so that it may not affect the electrical and optical characteristics of the laser diode.

In summary, by increasing the thickness of the end-face breakage preventing layer of rubber-like silicone resin, a resin-sealed laser diode device high in reliability with its electrical and optical characteristics maintained unchanged for a long time can be realized.

DETAILED DESCRIPTION OF THE PREFERRED EMBODIMENTS

Preferred embodiments of the present invention will be described with reference to the accompanying drawings.

Figure 1:
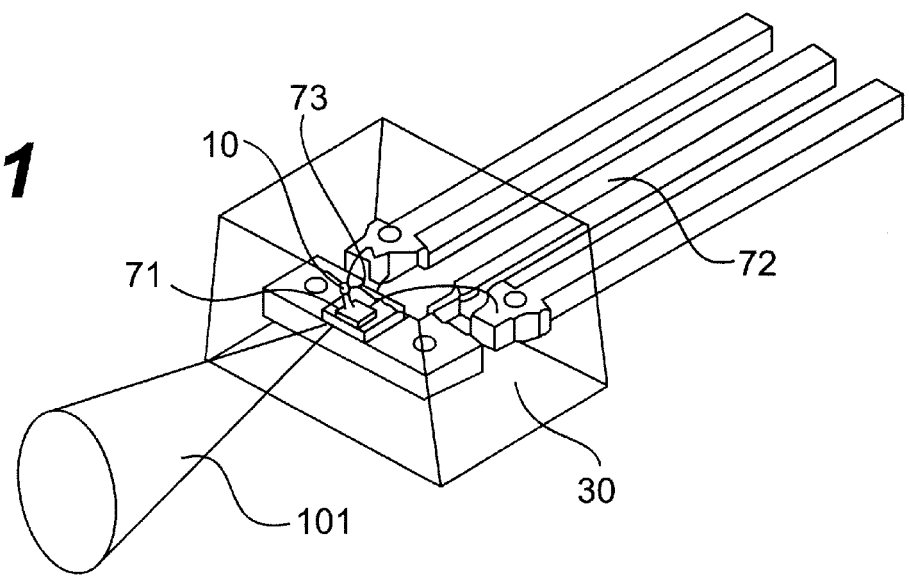
FIG. 1 is a perspective view showing an example of a resin-sealed laser diode device according to the present invention.
Figure 2:
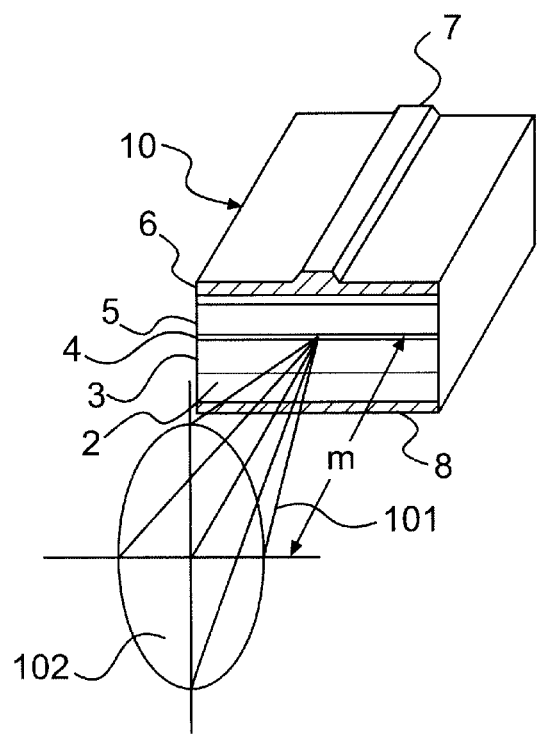
FIG. 2 is a perspective view, with parts cut away, of the device shown in FIG. 1.
Figure 3:
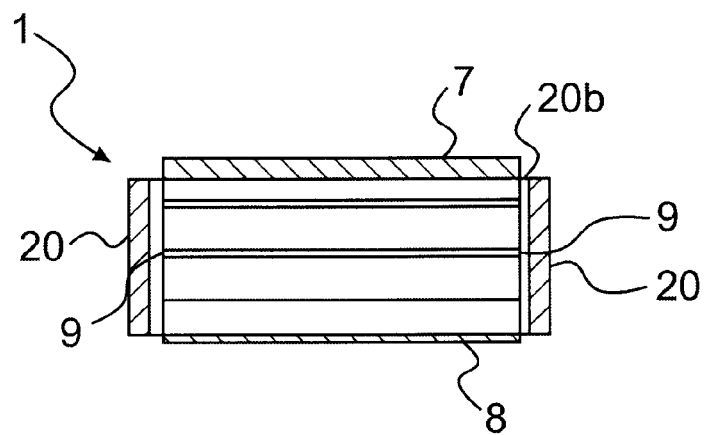
FIG. 3 is a sectional view of the device shown in FIG. 1.
Figure 4:
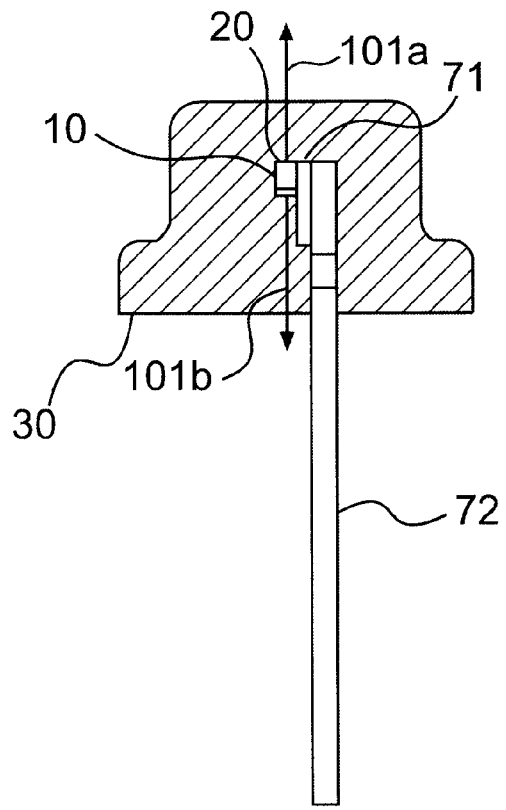
FIG. 4 is a sectional view of another example of the resin-sealed laser diode device according to the present invention.
Figure 8A:
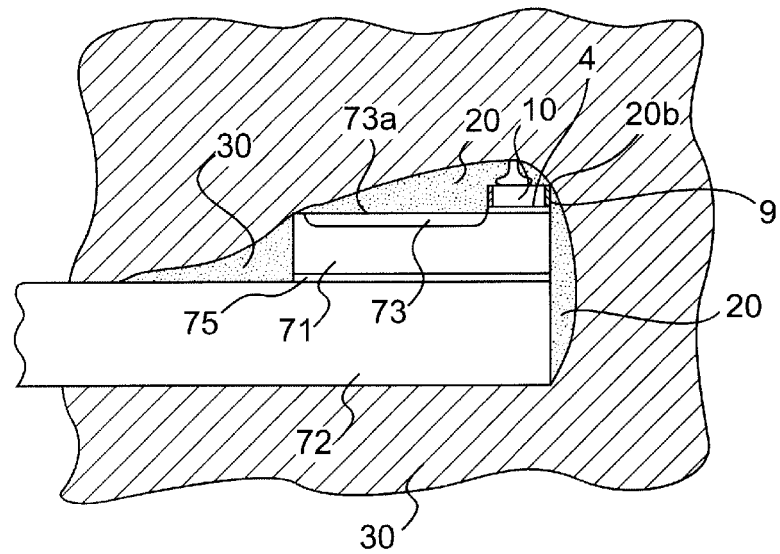
FIGS. 8(a) to 8(c) are a vertical sectional view, a plan view with parts cut away, and a side view with parts cut away, respectively, showing an example of the coating region of the end-face breakage preventing layer formed in the resin-sealed laser diode device according to the present invention.
Figure 8B:
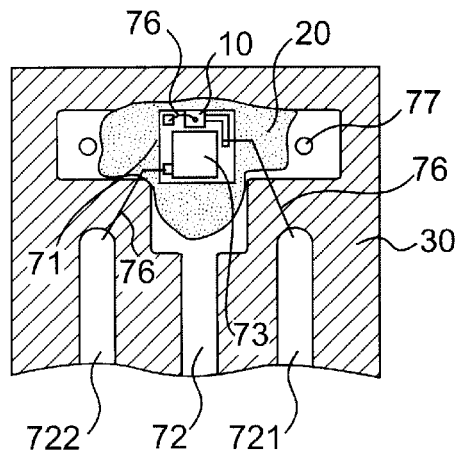
Figure 8C:
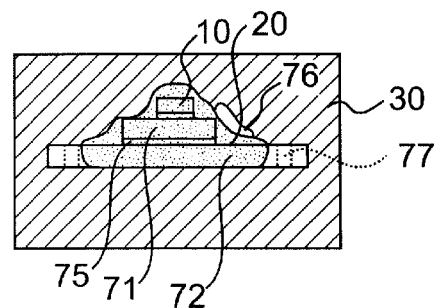
Figure 9:
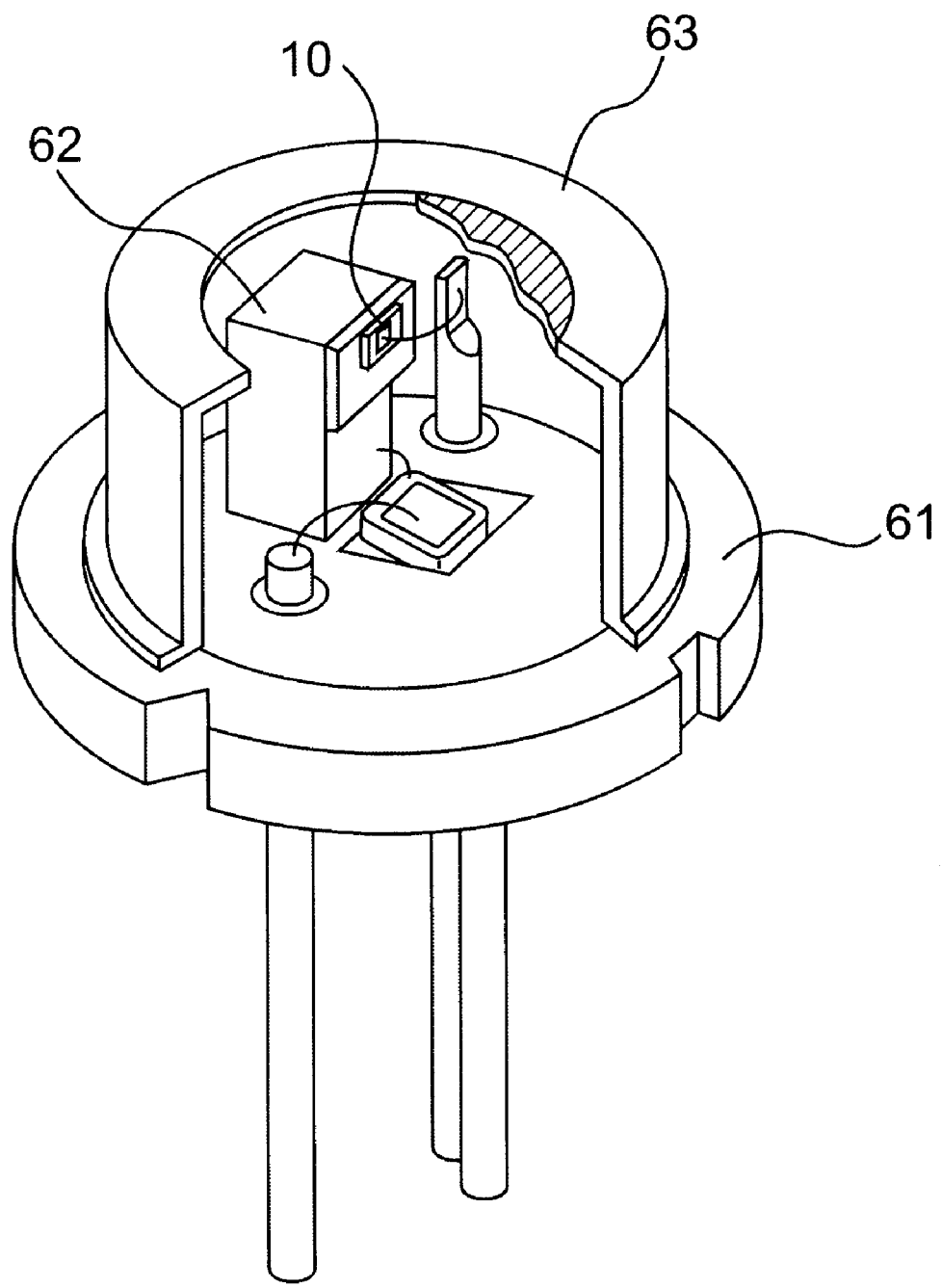
FIG. 9 is a perspective view, with parts cut away, showing a conventional can-type laser diode device.

FIG. 1 is a perspective view showing a resin-sealed laser diode device, which constitutes one embodiment of the present invention. FIGS. 8(a) to 8(c) particularly concern the present invention. More specifically, FIG. 8(a) is an enlarged sectional side view of the resin-sealed laser diode device having an end-face breakage preventing layer between a sealing resin layer 30 and a laser diode chip 10, and FIGS. 8(b) and 8(c) are a plan view and a front view of the resin-sealed laser diode device, respectively, from which the sealing resin is partially removed. As shown in FIGS. 8(a), the laser diode chip 10 is mounted in place on a silicon substrate, namely, a heat radiating board 71, in which a photo-diode 73 is formed. The laser diode chip 10 thus mounted is covered with an end-face breakage preventing layer 20 of silicone resin with a thickness of at least 50 μm. The laser diode chip 10 thus covered is sealingly covered with a sealing resin (transparent epoxy resin) 30.

More specifically, the end-face breakage preventing layer 20 is formed by a coating method which utilizes the properties of rubber-like organic material. That is, the end-face breakage preventing layer 20 has an external configuration like a drop formed by a dropping method which is suitable for mass production. As shown in FIGS. 8(b) and 8(c), the end-face breakage preventing layer is spread around the chip 10. That is, on the side of the front light-emitting end face 9, the end-face breakage preventing layer covers the side surfaces of the heat radiating board 71 and of a lead frame 72; and on the side of the rear light-emitting end face, it covers the light-receiving section 73a of the photo-diode and the upper surface of the lead frame 72. Furthermore, on the right and left of the chip 10, the end-face breakage preventing layer spreads over the surface of the heat radiating board 71, and reaches through-holes 77 which are formed to cause the sealing resin 30 to sufficiently stick on the lead frame 72. As was described above, the end-face breakage preventing layer is spread wide; however, it is not spread over the lower surface of the lead frame 72. This is because, if the end-face breakage preventing layer 20 of silicone resin which is low in adhesion to the sealing resin 30 spreads over the lower surface of the lead frame 72, then the adhesion of the sealing resin 30 to the lead frame 72 is lowered.

Now, a method of forming the end-face breakage preventing layer will be described.

First, the photo-diode 73 is formed in the heat radiating board 71, and then the laser diode chip 10 is soldered in place onto the heat radiating board 71 by the junction down method. Thereafter, the heat radiating board 71 is fixedly secured onto the lead frame 72 with an Ag epoxy adhesive 75. Under this condition, the chip 10, the electrodes of the photo-diode 73, and the external lead electrode terminals 721 and 722 of the lead frame 72 are connected to one another with gold (Au) wires 76 by wire bonding. Thereafter, a dispenser (not shown) is used to drop a suitable amount of silicone resin on the chip 10. The silicone resin thus dropped spreads over the heat radiating board 71 and the lead frame 72 by surface tension. In the case where thermosetting silicone resin is used, it is heated and solidified in a clean oven. Thus, the end-face breakage preventing layer 20 has been shaped as shown in FIGS. 8(a) to 8(c). In the case where an ultra-violet-setting silicone resin is used, ultraviolet rays are applied to it to form the end-face breakage preventing layer 20 with the similar configuration.

A plurality of laser diode devices were formed by using a variety of silicone resins as coating material, and by sealing them with transparent epoxy resin. The laser diode devices thus formed were tested for life time, and their electrical and optical characteristics were investigated at predetermined time intervals. The tests were carried out under the APC (automatic power control) for an ambient temperature of 60° C. and an optical output of 5 mW. The term "life time" as used herein is intended to means the time which elapses until the sealing resin is optically damaged, thus changing the optical output of the laser diode. The kinds of silicone resins (rubber, varnish, resins A, B, C and D), the quantities of dropped silicone resin, and the film thicknesses are as indicated in the following Table 1: The resins A, B and C were like rubber, and had about 50, 20 and 50 in rubber hardness (the larger, the harder) according to JIS. A, respectively. The resin D was varnish. The film thicknesses were measured on the extension of the surface of the active layer of the laser diode chip on the side of the front light-emitting end face of the latter. The resin C was ultraviolet-setting resin, and the resins A, B and D were thermosetting resins.

TABLE 1

| No. | Kind | Silicone resin | Main component | Quantity of drop (mg) | Solidifying condition | Film thickness (μm) |
| --- | --- | --- | --- | --- | --- | --- |
| 1 | Rubber | A | Dimethyl polysiloxane | 0.3 | 150° C., 4 hours | 25 |
| 2 | | A | | 0.6 | 150° C., 4 hours | 50 |
| 3 | | B | | 0.3 | 150° C., 4 hours | 29 |
| 4 | | B | | 0.6 | 150° C., 4 hours | 53 |
| 5 | | C | | 0.3 | UV application 1000 mJ | 27 |
| 6 | | C | | 0.6 | UV application 1000 mJ | 55 |
| 7 | Varnish | D | | 0.3 | 150° C., 4 hours | 23 |
| 8 | | D | | 0.6 | 150° C. 4 hours | 47 |

In each of the specimens, the end-face breakage preventing layer was formed, and then it was sealed with the transparent epoxy resin. The test was given under the above-described conditions, and the relationships between the film thickness of the end-face breakage preventing layer and the life time were investigated, and the electrical and optical characteristics of the laser diode were investigated at predetermine time intervals during the test, to determine whether or not the laser diode was acceptable.

The life time was indicated in MTTF values. The electrical and optical characteristics were "current to optical output (I-L)", "current to voltage (I-V)", "photo-diode monitor current value (Im)", and "far field pattern (FFP)". The defective percent (%) was a cumulative defective percent (%) with respect to that of the laser diode which was normal in "current to optical output (I-L)". The results of measurement are as indicated in the following Table 2:

TABLE 2

| No | Kind | Silicone resin | Film thickness (μm) | Life time (Hrs) | Monitor current (Im) | Other characteristics |
|---|---|---|---|---|---|---|
| 1 | Rubber | A | 25 | About 5000 | 25 | 0 |
| 2 | | A | 50 | About 20000 | 1 or less | 0 |
| 3 | | B | 29 | About 5000 | 20 | 0 |
| 4 | | B | 53 | About 20000 | 1 or less | 0 |
| 5 | | C | 27 | About 5000 | 35 | 5 (FEP bad) |
| 6 | | C | 55 | About 20000 | 15 | 5 (FEP bad) |
| 7 | Varnish | D | 23 | About 5000 | 30 | o |
| 8 | | D | 47 | 1,000 or less | 10 | o |

Note
*1 - Resins A, B and D are thermosetting resins.
*2 - Resin C is an ultraviolet-setting resin.

The results of measurement indicated in Table 2 reveals that, in the cases of thermosetting rubber-like silicone resins (dimethyl polysiloxane) of Nos. 1 through 4, as the film thickness increased, the life time was increased, and the defective percent with respect to monitor current value (Im) was greatly reduced. The reason why the monitor current value (Im) was defective was studied by taking the laser diode device into pieces. As a result, it was found that in each of the unacceptable laser diodes, the interfacial separation occurred between the sealing resin and the silicone resin over the photo-diode.

On the other hand, in the case of ultraviolet-setting rubber-like silicone resins of Nos 5 and 6, the life time was similar in tendency to that in the case of the thermosetting silicone resins; however, the defective percent with respect to the monitor current value (Im) was higher. The defective percent was not so decreased even if the film thickness was increased. In addition, the far field pattern (FFP) was unsatisfactory with high percentage which was due to the interfacial separation between the silicone resin and the sealing resin. Thus, employment of those silicone resins is not practical. The reason why the defective percent with respect to the monitor current was high, similarly as in the case of the thermosetting silicone resins, resided in the interfacial separation between the sealing resin and the silicone resin over the photo-diode.

On the other hand, in the case of the varnish, as the film thickness increases, although the defective percent with respect to the monitor current value (Im) was decreased, the life time was decreased. Hence, it is difficult to use the varnish.

Research was conducted on why the element was greatly reduced in life time when it was coated with the thick varnish, and the following fact was found:

Microscopic analysis was given to the No. 8 element in Table 2 which was coated with the thick varnish to detect its deteriorated portions, and the following fact was found: That is, although the sealing resin was not optically damaged at all, the "current to optical output (I-L) characteristic was lowered, so that the luminous efficiency was greatly decreased; and a number of dislocations took place in the active layer of the chip. Similarly as in the above-described case, microscopic analysis was given to the No. 7 element in Table 2, with the following results: That is, in almost all the elements which were deteriorated, the sealing resin was optically damaged, and in some of the elements a number of dislocations occurred in the active layer.

The cause for the quick deterioration of No. 8 element in Table 2 which was coated with the thick varnish may be as follows: That is, since the solidified varnish was considerably hard, the stress attributing to the difference in thermal expansion coefficient between the varnish and the chip was applied directly to the chip, as a result of which a number of dislocations occurred in the active layer, and the laser diode chip itself was deteriorated. Thus, in the case of the element which was coated with the thick varnish, although the defective percent with respect to the monitor current value was decreased, the life time was greatly reduced. Therefore, it was determined that employment of the varnish was not practical.

On the other hand, in the case of the thermosetting rubber-like silicone resin, the deterioration due to the stress was not involved. That is, as is seen from the fact that Nos. 2 and 4 elements in Table 2, which are different from each other in the hardness, were substantially equal in characteristic, the stress is absorbed by the rubber even if induced, and therefore the chip is substantially free from the stress. Hence, it was considered that no deterioration was caused by the stress.

Figure 10:
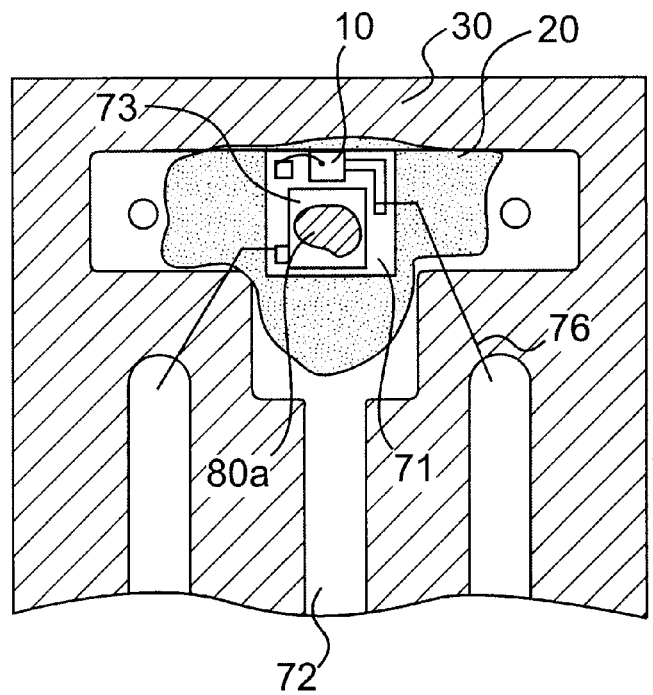
FIG. 10 is a plan view, with parts cut away, showing separations in the interface between the end-face breakage preventing layer and the sealing resin in the resin-sealed laser diode device which is deteriorated.
Figure 11:
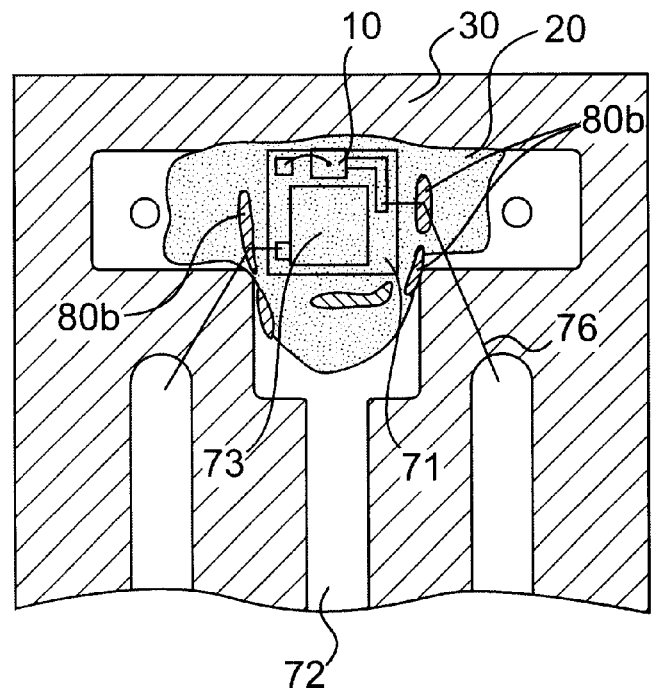
FIG. 11 is a plan view, with parts cut away, showing separations in the interface between the end-face breakage preventing layer and the sealing resin in the resin-sealed laser diode device which is not deteriorated.

In order to find the reason why coating the element with the thick thermosetting rubber-like silicone resin was able to prevent the occurrence of unacceptable devices with respect to the monitor current value, Nos. 2 and 4 elements of thick coating type and Nos. 1 and 3 elements of standard coating type in Table 2 were examined for the interfacial separation between the silicone resin on the photo-diode and the sealing resin. Among Nos. 1 through 4, those which were unacceptable in monitor current value had defects as follows: That is, as shown in FIG. 10, there were separations 80a formed in the interface between the silicone resin 20 over the photo-diode 73 and the sealing resin 30. On the other hand, as indicated in Table 2, Nos. 2 and 4 elements were longer in life time than the others. As can be estimated from this fact, in Nos. 2 and 4 elements the interfacial separation was originally low in the probability of occurrence, and occurred not in the interface between the silicone resin on the photo-diode 73 and the sealing resin but in the interface at the portion which surrounded the photo-diode 73 and the heat radiating board 71 from outside, as shown in FIG. 11. From the above-described facts, it can be considered that, in Nos. 2 and 4 elements of thick coating type, the defective percent with respect to the monitor current value was greatly reduced because originally the interfacial separation scarcely occurred, and even when occurred, it was located in the region through which the laser beam does not pass.

Figure 12A:
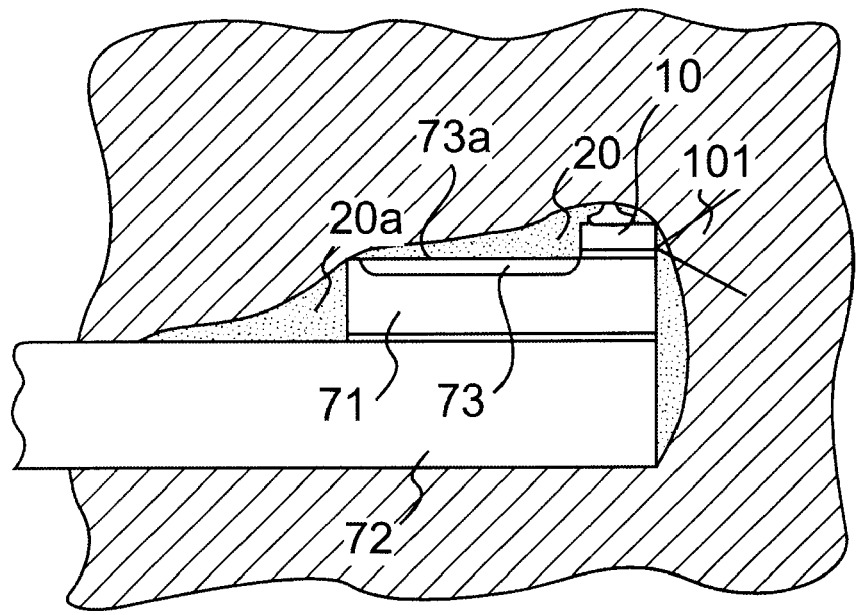
FIGS. 12(a) and 12(b) are sectional views for a description of the variation in sectional configuration of the end-face breakage preventing layer in the resin-sealed laser diode device.
Figure 12B:
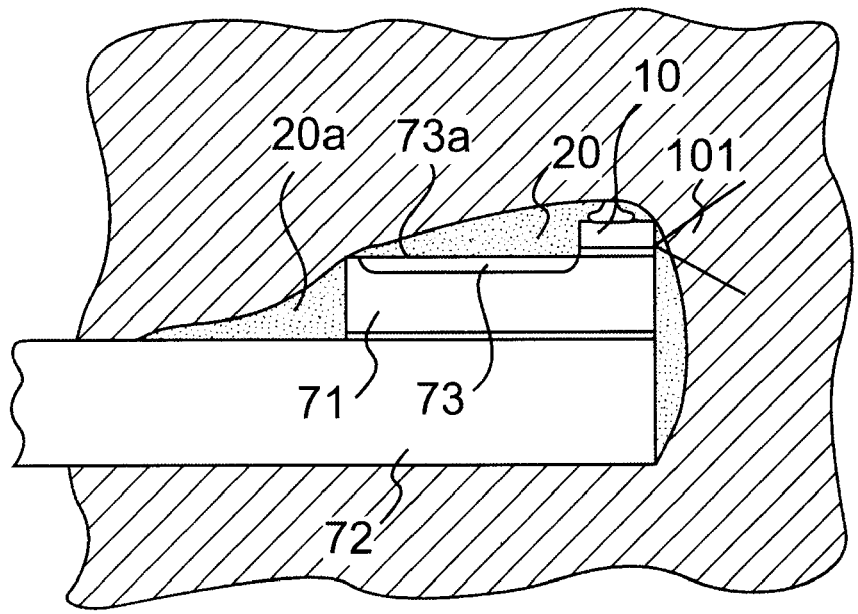

FIGS. 12(a) and 12(b) are sectional views of the element of standard coating type and the element of thick coating type, respectively. As shown in FIG. 12(a), in the element of standard coating type, the sectional configuration of the end-face breakage preventing layer 20 on the photo-diode 73 was curved towards the light receiving surface of the photo-diode 73, whereas as shown in FIG. 12(b), in the element of thick coating type, it was flat or somewhat curved outwardly of the light receiving surface of the photo-diode 73. The sections of the elements were observed more closely, and the following fact was found: In the element of thick coating type, the sectional configuration 20a of the end-face breakage preventing layer 20 which was stuck onto the periphery of the heat radiating board 71 where the interfacial separation occurred, was curved towards the lead frame 72. That is, the interfacial separation was concentrated at the portion of the end-face breakage preventing layer which was curved inwardly. Thus, it can be considered that the interfacial separation occurred because of the concentration of the stress attributing to the difference in thermal expansion coefficient between the end-face breakage preventing layer and the sealing resin to the portion of the end-face breakage preventing layer which was curved inwardly.

On the other hand, in the case of the ultraviolet rubber-like silicone resin, the resultant configuration appeared substantially equal to that in the case of the thermosetting silicone resin; however, the interfacial separation often occurred in the interface between the silicone resin on the photo-diode and the sealing resin. As is seen from Table 2, the interfacial separation occurred on the side of the front light-emitting end face in the same manner, thus making the far field pattern (FFP) unsatisfactory. In the case of the thermosetting silicone resin, application of ultraviolet ray thereto prevented the occurrence of interfacial separation in the interface between the silicone resin on the front light-emitting end face and the sealing resin; however, in the case of the ultraviolet-setting silicone resin, the same treatment was not effective at all.

The reason why, in the case of the ultraviolet-setting rubber-like silicone resin, the interfacial separation occurred in the interface between the silicone resin and the sealing resin may be considered as follows: That is, the surface state of the silicone resin was changed by the ultraviolet intensifier and ultraviolet sensitive radical contained in the ultraviolet-setting resin, thus decreasing the strength of adhesion of the silicone resin to the sealing resin. Thus, it was determined that the employment of the ultraviolet-setting rubber-like silicone resin was not practical.

Making the end-face breakage preventing layer 50 μm or more in thickness at the above described predetermined position is related to the upwardly curved portion of the rubber-like silicone resin layer on the photo-diode. However, in practice, the defects were located in different portions of the end-face breakage preventing layer; for instance, they were located on the side of the front light-emitting end face of the chip and on the side of the rear light-emitting end face. Hence, the descriptions have been made separately according to the positions of the defects.

In the case where, as was described above, the material of the end-face breakage preventing layer is the thermosetting rubber-like organic silicone resin, and the end-face breakage preventing layer is coated thick, and the thickness of the end-face breakage preventing layer is set to at least 50 μm on the extension of the surface of the active layer of the laser diode chip on the side of the front light-emitting end face of the chip, the life time is increased to more than 20,000 hours. In addition, in the case where the interface of the rubber-like silicone resin layer is curved upwardly with respect to the light receiving surface of the photo-diode so that no interfacial separation occurs at least over the photo-diode on the side of the rear light-emitting end face, the defective percent with respect to the monitor current value of the photo-diode is reduced. Hence, it is desirable for the laser diode device to have the above-described two structural arrangements. However, it goes without saying that the laser diode having only the former structural arrangement in which the film thickness is set to 50 μm or more, is sufficiently practical in use. Hereinafter, it is assumed that the rubber-like organic silicone resin is of thermosetting type.

A method of manufacturing the above-described resin-sealed laser diode device will be described. More specifically, a method of manufacturing the resin-sealed laser diode device in which the end-face breakage preventing layer is made large in thickness by increasing the quantity of silicone resin dropped through the dispenser.

Figure 13:
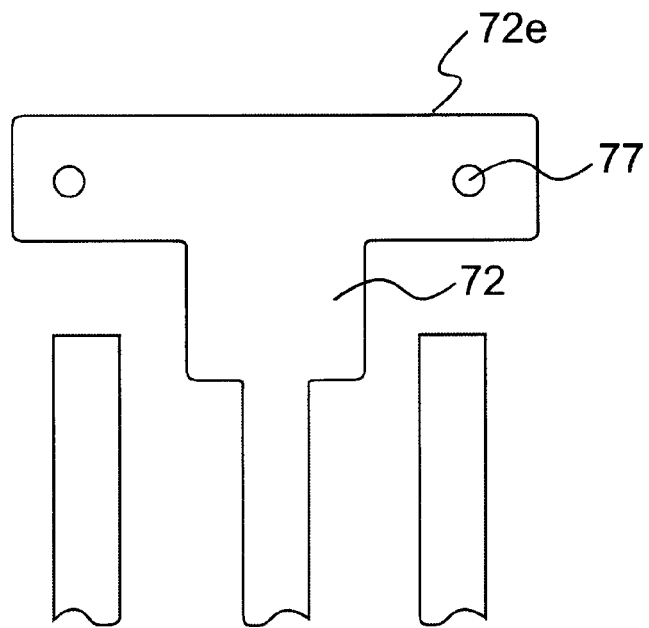
FIG. 13 is a plan view showing an example of a lead frame in the resin-sealed laser diode device according to the present invention.

FIG. 13 is a plan view of the lead frame 72 in the resin-sealed laser diode device according to the present invention. The lead frame 72 is T-shaped, having a portion on which the heat radiating board is fixedly mounted so that the photo-diode is formed therein and the laser diode chip is mounted thereon. The portion is made relatively large in area for improvement in heat radiation effect. Through-holes 77 are formed in both end portions of the horizontal bar of the T-shaped lead frame 72 so as to allow the sealing resin to sufficiently stick onto the lead frame 72. The lead frame 72 is plated with silver (Ag). Therefore, the adhesion of the lead frame 72 to the sealing resin which is transparent epoxy resin is satisfactory, but the adhesion of the silicone resin and the sealing resin which is made of the transparent epoxy resin is, in general, not satisfactory. Hence, it is desirable that, in forming the end-face breakage preventing layer, the silicone resin is dropped onto the laser diode chip on the lead frame by using the dispenser without the difficulties that the resin spreads wide while reducing its thickness, and the resin flows over to the rear of the chip to increase the resin surface which is low in adhesion to the sealing resin. When the end-face breakage preventing layer is increased in thickness according to the present invention, then the resin is liable to flow over to the rear of the chip. This difficulty may be eliminated by using a lead frame 720 which has a protrusion 72c at the head of the T-shaped portion.

Figure 15:
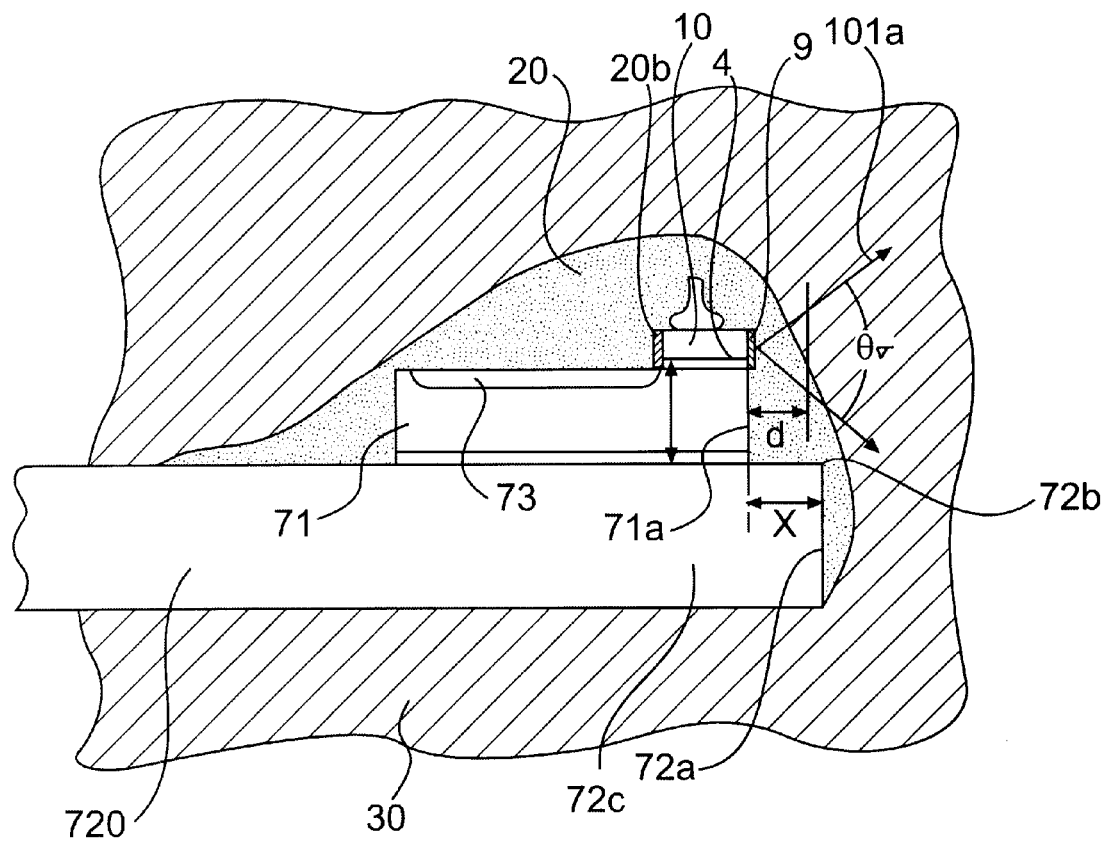
FIG. 15 is a sectional view of the resin-sealed laser diode device using the lead frame shown in FIG. 14, FIGS. 16(a) and 16(b) are sectional views showing separations formed in the interface between the end-face protecting film and the end-face breakage preventing layer in the deteriorated resin-sealed laser diode device.

FIG. 15 is an enlarged sectional view of a laser diode device according to the present invention which employs the aforementioned lead frame 720 with the protrusion 72c.

As shown in FIG. 15, the laser diode chip 10 is soldered onto the heat radiating board 71 made of a Si substrate with the front light-emitting end face 9 held flush with the side end face 71a of the heat radiating board 71. The heat radiating board 71 supporting the chip 10 is fixedly bonded to the base of the protrusion 72c of the lead frame 720 with the front light-emitting end face 9 of the chip 10 held flush with the end face 72e of the T-shaped shoulder of the lead frame 720. In this case, the resin dropped to form the end-face breakage preventing layer is collected on the protrusion 71c. Hence, increasing the quantity of resin thus dropped does not cause the resin to flow over to the rear of the chip, and therefore the end-face breakage preventing layer can be increased in film thickness d. However, it is important that the distance X between the tip end of the protrusion 72c on which the resin is collected and the portion just under the front light-emitting end face of the chip is selected to the extent that the laser beam emitted from the chip is not substantially blocked by the lead frame 72 even if spread; i.e., the laser beam having a divergent angle corresponding to the half-width of the laser beam intensity distribution is not blocked thereby.

Increasing the distance X permits an increase in the film thickness of the end-face breakage preventing layer; however, in practice, the upper limit of the distance X is determined by the following expression:

$$0 < X < L \cot(\theta_v/2)$$

where L is the distance between the lead frame and the active layer, and $\theta_v$ is the full width angle at half maximum, in the vertical emission direction, of the laser beam 101a.

As was described above, in order to increase the end-face breakage preventing layer in film thickness, the lead frame 720 having the protrusion 72c may be used. The same effect can be obtained by the following method: The laser diode chip fixedly mounted on the heat radiating board is fixedly mounted on the lead frame 72 in such a manner that it is shifted inwardly from the end face 72e of the lead frame 72 to the extent that the laser beam is not blocked by the lead frame 72.

In view of the characteristics of the laser diode device, it is preferable to increase the distance between the through-holes 77 in the lead frame 72, and to increase the area of the heat radiating portion, surrounding the through-holes 77, of the lead frame 72.

As long as the resin is not permitted to flow over to the rear of the chip, the silicone resin covering the photo-diode is increased in film thickness as the quantity of resin thus dropped increases, and it is curved outwardly of the light receiving surface of the photo-diode as shown in FIG. 15.

Figure 14:
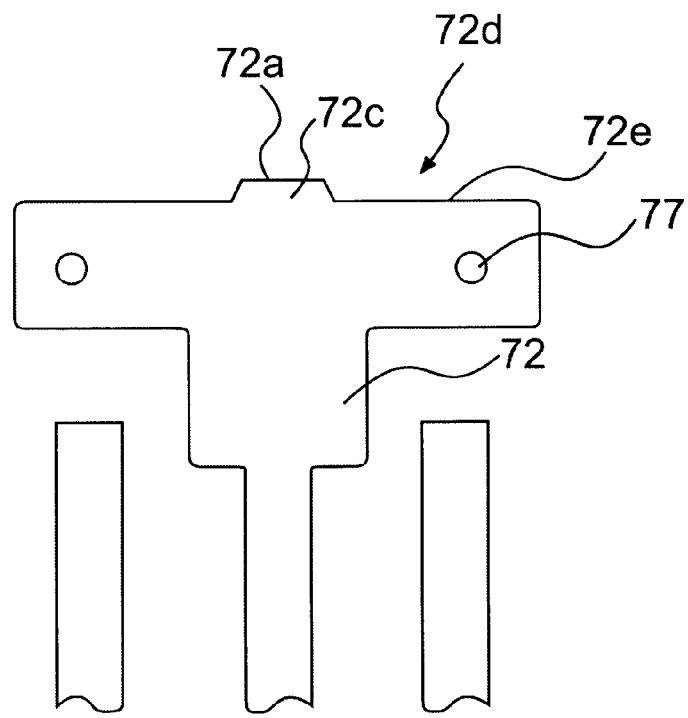
FIG. 14 is a plan view showing another example of the lead frame in the resin-sealed laser diode device according to the present invention.

Resin-sealed laser diode devices were formed as specimens as follows: The chip was fixedly mounted on the lead frame 720 shown in FIG. 14 or on the lead frame 72 shown in FIG. 13 in such a manner that it was shifted inwardly from the end face of the lead frame to the extent that the laser beam was not blocked by the lead frame, and the end-face breakage preventing layer was changed in thickness in a range of from 20 µm to 170 µm. And, similarly as in the case of the above-described Table 2, those devices were investigated for electrical and optical characteristics to determine their acceptability. The results of investigation are as indicated in the following Table 3.

TABLE 3

| No | Kind | Silicone resin | Film thickness (µm) | Life time (Hrs) | Monitor current (Im) | Defective percent (%) Other characteristics |
|---|---|---|---|---|---|---|
| 7 | Rubber | A | 20–30 | 3800–12000 | 25 | 0 |
| 8 | | A | 30–50 | 6000–15000 | 10 | 0 |
| 9 | | A | 50–60 | 15000 or more | 0 | 0 |
| 10 | | A | 120 | 30000 or more | 0 | 0 |
| 11 | | A | 170 | 60000 or more | 0 | 0 |

According to the above-described silicone resin dropping method, increasing the film thickness of the end-face breakage preventing layer to at least 50 µm as indicated in table 3 permits the silicone resin covering the light receiving surface of the photo-diode to be curved upwardly in sectional configuration. Hence, almost all of the devices were free from the difficulty that the monitor current value was unacceptable, and were greatly increased in life time. Thus, the laser diode device in which the end-face breakage preventing layer is 50 µm or more has been proved excellent by a reliability test such as a heat shock test and a high-temperature high-humidity test.

In the device, the photo-diode should be arranged so that its light receiving surface is substantially in parallel with the direction of emergence of the laser beam; however, it is not always necessary to set the photo-diode in the heat radiating board; that is, the photo-diode may be separated from the heat radiating board. The present invention has been described with reference to the case where the end-face breakage preventing layer is formed by using the rubber-like organic silicone resin essentially containing dimethyl polysiloxane. However, it goes without saying that, instead of the dimethyl resin, a resin having an alkyl group in the auxiliary chain may be employed. In addition, it is desirable to use a technique of applying ultraviolet rays to the surface of the end-face breakage preventing layer to improve the adhesion of the end-face breakage preventing layer to the sealing resin, which has been disclosed in Japanese Patent Application No. Hei. 3-329023 (published on Jun. 25, 1993 under Publication (Kokai) No. Hei. 5-160521).

Figure 5:
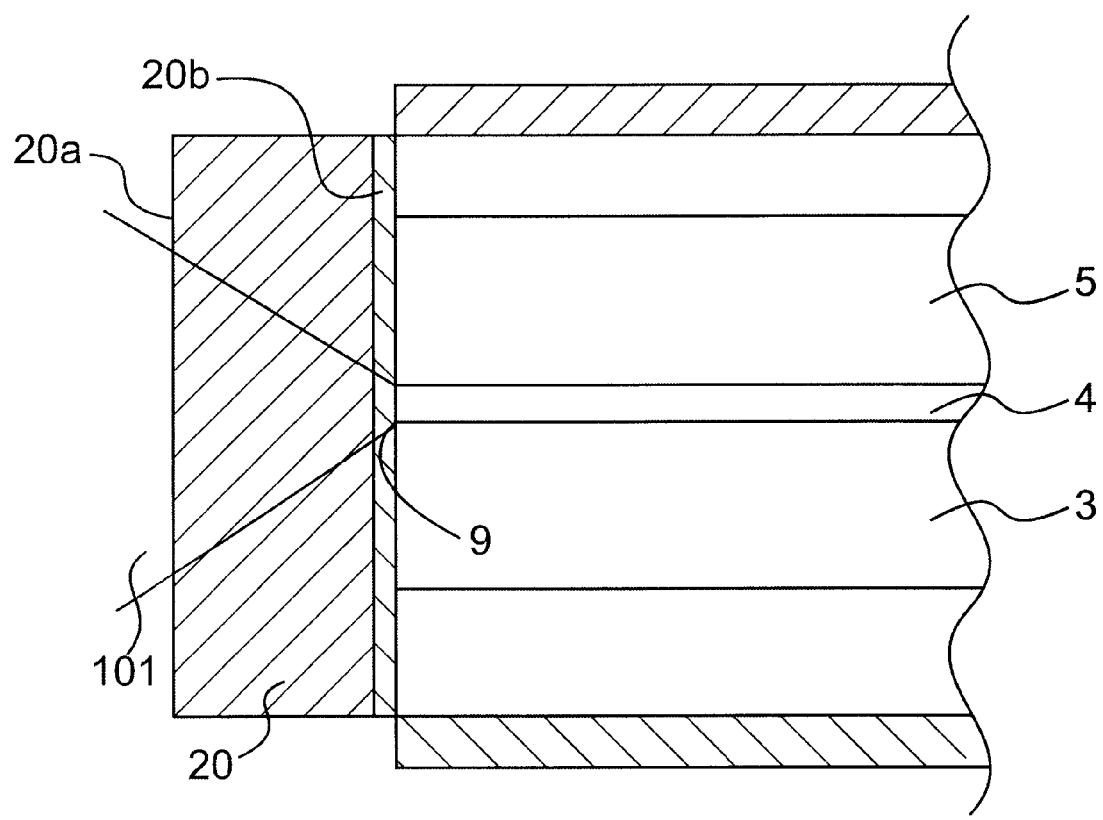
FIG. 5 is an enlarged sectional view showing essential components of a laser diode chip according to the present invention.
Figure 6A:
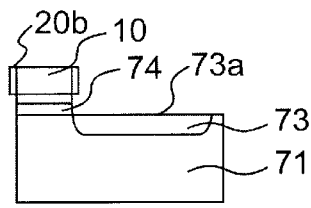
FIGS. 6(a) to 6(e) are diagrams showing steps of manufacturing the resin-sealed laser diode device according to the present invention.
Figure 6B:
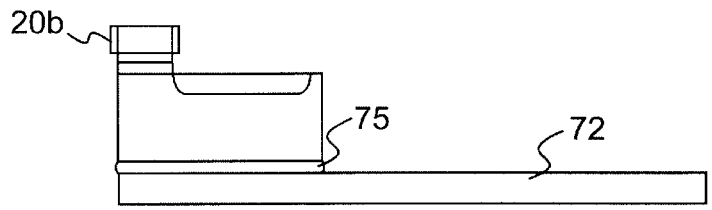
Figure 6C:
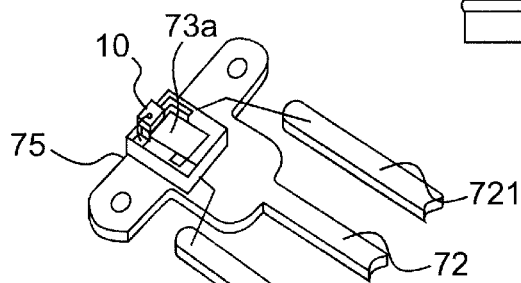
Figure 6D:
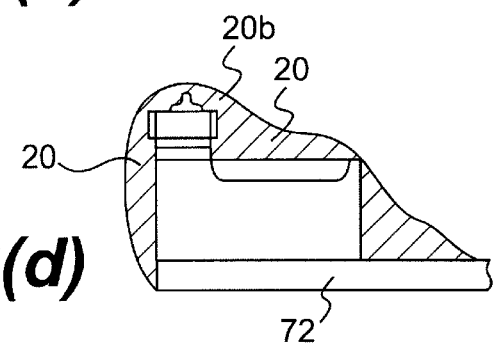
Figure 6E:
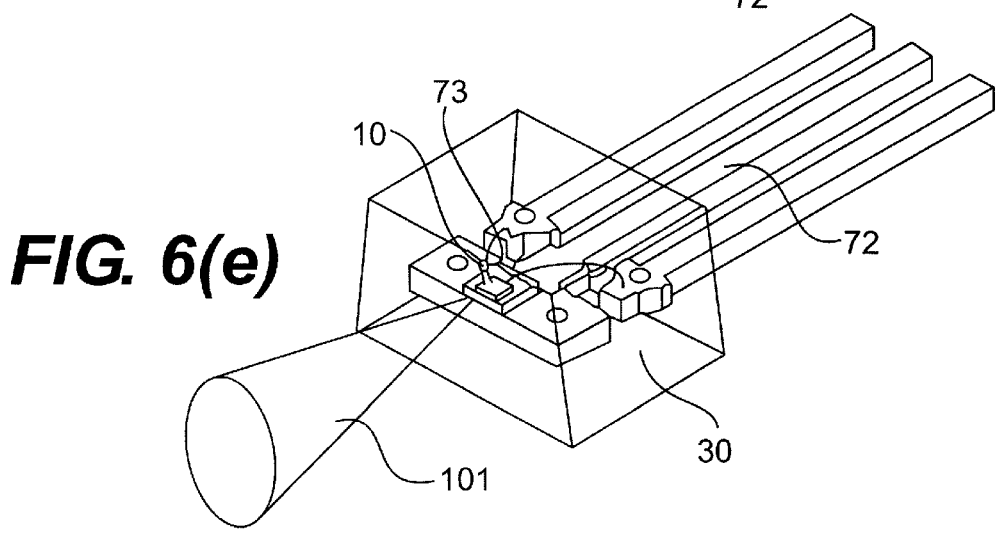

Now, a method of forming the end face protecting film 20b on the light-emitting end face 9 of the laser diode chip 10 as shown in FIG. 5, will be described.

Figure 17:
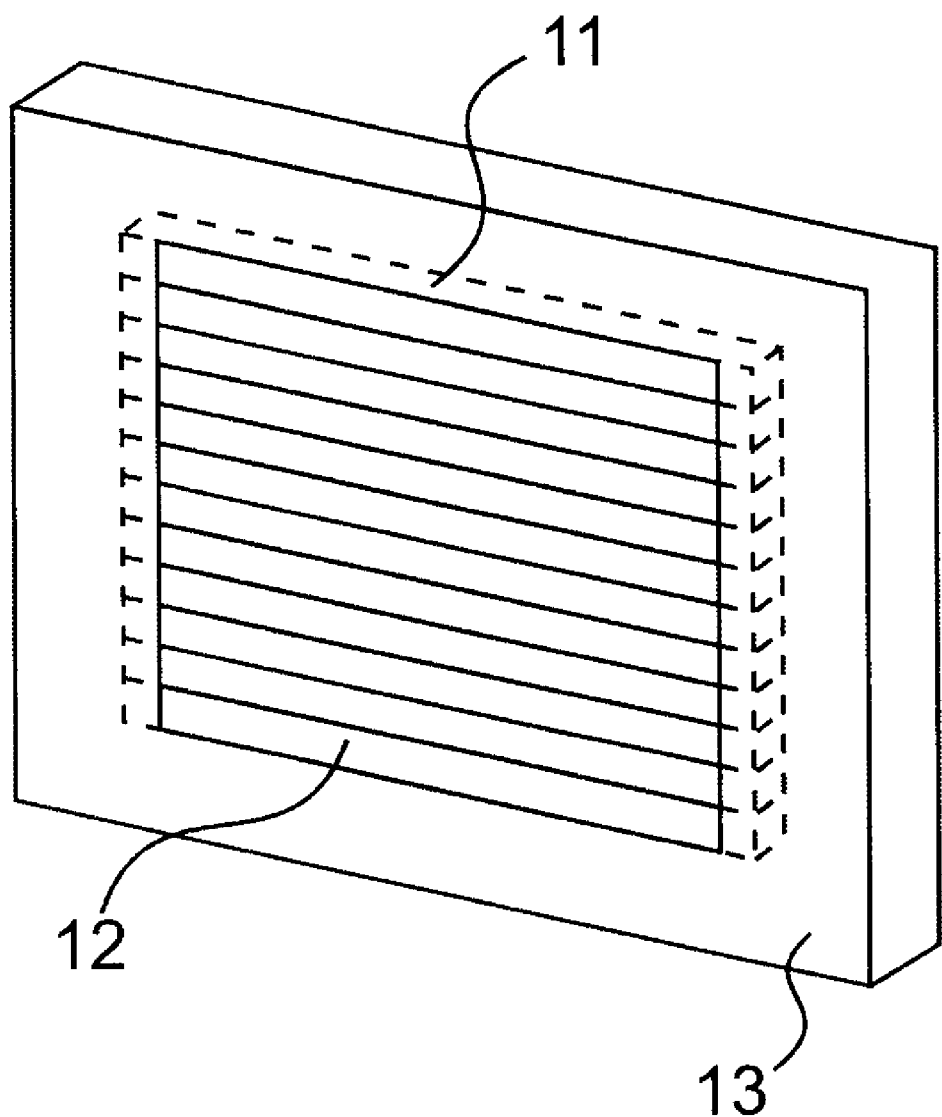
FIG. 17 is a perspective view of a jig for electron beam vapor deposition.

A rectangular wafer with p- and n-electrodes which has a laser diode structure including an active layer and others is formed to a thickness of 100 µm. The rectangular wafer thus formed is cleaved in a direction perpendicular to the direction of emission of the laser beam into elongated pieces; that is, LD bars 200 µm in width (resonator length) and 10 mm in length are formed in which laser diode chips are arranged side by side. The cleavage surfaces of the LD bars correspond to the light-emitting end faces 9, and they must be of a mirror surface. End-face protecting films 20b are formed on both cleavage surfaces of each LD bar by coating them with insulating dielectric. The resultant insulating dielectric film may be a multi-layer film of different materials. The coating method may be sputtering, CVD, or electron beam (EB) vapor deposition. In the embodiment, the electron beam vapor deposition is employed. That is, as shown in FIG. 17, the LD bars 11 are stacked one on another in a vapor deposition jig 13 in such a manner that, with the p-electrodes set above, the cleavage surfaces are in one and the same plane. The LD bars 11 are fixed at both ends. Thereafter, the jig 13 with the LD bars is set in a vapor deposition chamber. The jig 13 has a window in its surface which is in parallel with the cleavage surfaces 12, on both sides, of the LD bars 11, so that the cleavage surfaces 12 appear in the window. The jig 13 is so designed that it can be rotated and revolved. Therefore, after the cleavage surface on one side are subjected to electron beam vapor deposition, the jig 13 is turned 180° so that the cleavage surfaces on the opposite side can be treated in the same manner. After the vapor deposition chamber has been evacuated to $1 \times 10^{-4}$ Pa, the electron beam is applied to a desired one of the vapor deposition sources (silica, alumina, titania, and zirconia, 10 mm in diameter×3 mm in length) accommodated in containers, to heat and vaporize it. The shutter is opened for a predetermined period of time to deposit the vapor on the cleavage surfaces to a predetermined thickness. Thereafter, the shutter is closed, and the application of the electron beam is suspended. The thickness of the end-face protecting film thus formed can be accurately controlled, because it is measured with a film-thickness measuring instrument of quartz oscillator type. A multi-layer film can be formed by using the vapor deposition sources alternately, and the vapor depositions can be achieved successively in the chamber kept closed. After the cleavage surfaces on one side have been subjected to electron beam vapor deposition as required, the chamber is opened, and the jig is turned 180°. Under this condition, the cleavage surfaces on the other side are treated in the same way. After all the cleavage surfaces have been treated, the LD bars are removed from the jig. Each LD bar is cut at intervals of 250 µm, to form the laser diode chips 10.

Resin-sealed laser diode devices were formed as specimens in which, as was described above, the end-face protecting films 20b were formed by using a variety of materials, and a rubber-like organic silicone resin essentially containing dimethyl polysiloxane was used to form the end-face breakage preventing layer to a thickness of at least 50 μm. Reliability tests such as a life time test and a heat cycle test were given to the devices thus formed, and the electrical and optical characteristics of the latter were investagted every predetermined period of time.

The life time test was carried out under the APC (automatic power control) for an ambient temperature of 60° C. and an optical output of 5 mW. The life time is the time which elapses until the sealing resin is optically damaged, thus changing the optical output of the laser diode. The materials and film thicknesses of the end-face protecting films 20b in the devices thus tested, and the material and film thickness of the end-face breakage preventing films are indicated in the following Table 4: In the devices, the film thicknesses of the end-face protecting films 20b formed by a variety of materials were set to λ/2n (where λ=800 nm, and n=refractive index) for the respective materials.

TABLE 4

| | End-face protecting film | | End-face breakage preventing layer | |
|---|---|---|---|---|
| Sample No. | Material | Film thickness (nm) | Material | Film thickness (nm) |
| 1 | SiO$_2$ | 276 | Rubberlike dimethyl polysiloxane | 55 |
| 2 | Al$_2$O$_3$ | 250 | Rubberlike dimethyl polysiloxane | 53 |
| 3 | TiO$_2$ | 182 | Rubberlike dimethyl polysiloxane | 52 |
| 4 | ZrO$_2$ | 203 | Rubberlike dimethyl polysiloxane | 54 |

The end-face protecting films, and the end-face breakage preventing layer were formed under the above-described conditions, and the resultant products were sealed with transparent epoxy resin to form laser diode devices. A life test and a heat cycle test were given to the devices under the above-described test conditions, and during the test, the electrical and optical characteristics of the laser diode devices were investagted at predetermined time intervals to confirm any defect in the devices.

The life time was indicated in MTTF values. The electrical and optical characteristics were "current to optical output (I-L)", "current to voltage (I-V)", and "far field pattern (FFP)". The defective percent (%) was a cumulative defective percent (%) with respect to that of the laser diode which was normal in "current to optical output (I-L)" characteristic. The results of life test, and the results of heat cycle test are as indicated in the following Tables 5 and 6, respectively:

TABLE 5

| | | | Defective precent (%) | |
|---|---|---|---|---|
| Sample No. | End-face protecting film material | Life time (Hr) | Far field pattern (FEP) Im(Po = 3mW) | Electrical and optical characteristics other than FFP |
| 1 | SiO$_2$ | about 20000 | 0 | 0 |
| 2 | Al$_2$O$_3$ | about 20000 | 1 | 0 |
| 3 | TiO$_2$ | About 20000 | 2 | 0 |
| 4 | ZrO$_2$ | About 20000 | 2 | 0 |

TABLE 6

| Sample No. | End-face protecting film material | Defect item | Number of heat cycles | | | |
|---|---|---|---|---|---|---|
| | | | 100 | 200 | 300 | 400 |
| 1 | SiO$_2$ | FFP defect (%) | 0 | 0 | 0 | 0 |
| | | Defect other than FEP (%) | 0 | 0 | 0 | 0 |
| 2 | Al$_2$O$_3$ | FFP defect (%) | 0 | 9 | 8 | 12 |
| | | Defect other than FEP (%) | 0 | 0 | 0 | 0 |
| 3 | TiO$_2$ | FFP defect (%) | 0 | 6 | 12 | 12 |
| | | Defect other than FEP (%) | 0 | 0 | 0 | 0 |
| 4 | ZrO$_2$ | FFP defect (%) | 1 | 8 | 13 | 13 |
| | | Defect other than FEP (%) | 0 | 0 | 0 | 0 |

Table 5 indicates the defective percent values (%) with respect to the far field pattern (FFP) and the electrical and optical characteristics other than FFP which were detected in the life test. Table 6 indicates the defective percent values (%) with respect to the far field pattern (FFP) and the electrical and optical characteristics other than FFP which were detected in the heat cycle test. As is apparent from Tables 5 and 6, in the case where the material of the end-face protecting films is other than silicon dioxide, the far field pattern (FFP) are unsatisfactory both in the life test and in the heat cycle test. The probability that the far field pattern (FFP) is unsatisfactory in the heat cycle test is higher than that in the life test. The electrical and optical characteristics other than the far field pattern are satisfactory both in the life test and in the heat cycle test.

Figure 16A:
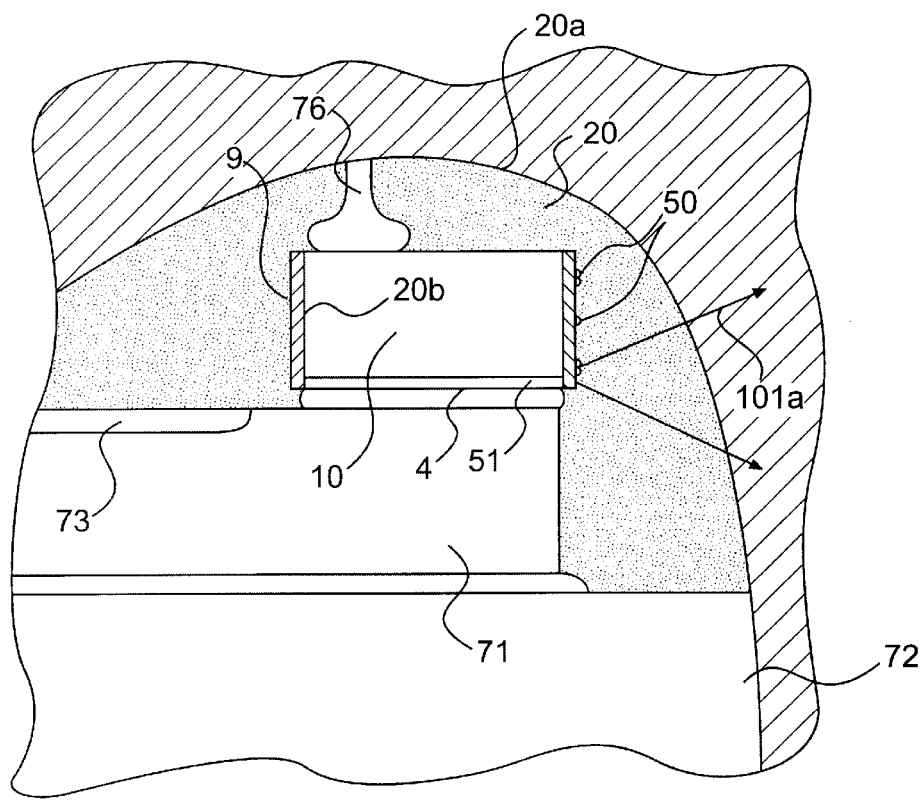
Figure 16B:
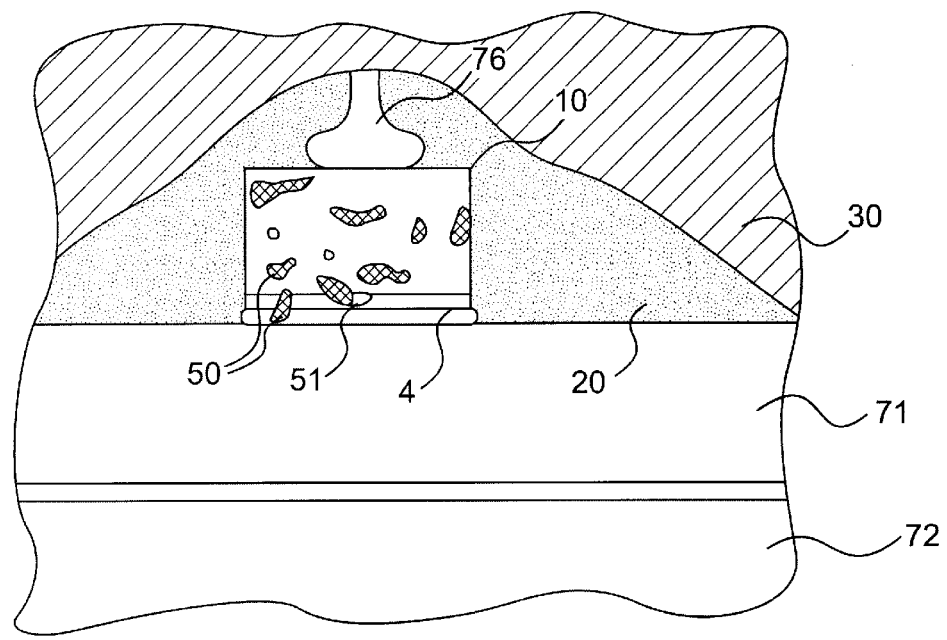

The laser beam emergence section of the unacceptable element was finely observed under the microscope. As a result, it was found that, as was described before, separations 50 were formed in the interface between the end-face protecting film 20b of Al$_2$O$_3$, TiO$_2$ or ZrO$_2$ formed on the light-emitting end face by coating and the end-face breakage preventing layer 20 of rubber-like organic silicone resin as indicated in FIGS. 16(a) and 16(b). The separations 50 were various in size, several micrometers (μm) to several tens of micrometers (μm). And the separations were formed at various points in the interface. In the unacceptable element, at least a part of the separation was on the laser beam emergence section 51. On the other hand, in the acceptable element, although separations were formed in the interface in the same manner, none of the separations were located over the laser beam emergence section 51. The laser beam emergence section 51 was about 5 μm×1 μm. In the case of the end-face protecting film 20b of Al$_2$O$_3$, TiO$_2$ or ZrO$_2$, it can be considered that separations occurred in the boundary between the latter 20b and the end-face breakage preventing layer 20 of rubber-like organic silicone resin, and some of the separations 50 were located at the laser-beam transmitting portion of the laser beam emergence section 5 to scatter the laser beam, so that the resulting far field pattern (FFP) was unsatisfactory. The separations occurred depending on the difference in thermal expansion coefficient between the laser diode chip and the rubber-like organic silicone resin; in other words, the separation occurred in the boundary between the end-face protecting film 20b and the end-face breakage preventing layer because of the difference in thermal expansion coefficient. Hence, in the heat cycle test, the number of unacceptable elements was larger than in the life test. In other reliability tests such as a high-heat high-humidity test (85° C., 85%×1,000 hours) and a solder heat-resistance test (260° C., 10 sec.×5 cycles), the devices were found which were defective in the same manner as those described above.

The devices in which the end-face protecting film was of $SiO_2$, were free from the above-described difficulty. That is, when the laser beam emergence section of the tested device was finely observed under the microscope, no separation was found in the boundary between the end-face protecting film and the rubber-like organic silicone resin 20. The reason for this may be considered as follows: Both the dimethyl polysiloxane which is an essential component of the rubber-like organic silicone resin of the end-face breakage preventing layer, and the $SiO_2$ of the end-face protecting film have Si—O coupling in the skeleton, and the chemical coupling, which is generated in adhesion of the end-face breakage preventing layer to the end-face protecting film, advances effectively to provide a high adhesion strength. Thus, it is preferable that the surface of the end-face protecting film is of $SiO_2$.

As was described above, in order to increase the strength of adhesion of the end-face protecting film and the end-face breakage layer to each other, $SiO_2$ is most suitable as the material of the end-face protecting film. In order to further increase the strength of adhesion, the surface of the end-face protecting film 20b may be cleaned by applying ultraviolet rays to it before the formation of the end-face breakage preventing layer.

Now, examples of the device in which the outer surface of the end-face protecting film of other than $SiO_2$ is lightly coated with $SiO_2$ to increase the strength of adhesion to the end-face breakage preventing layer, will be described.

In the above-described tests, the end-face protecting films were of a single layer structure. On the other hand, while it is required to prevent the oxidation of the light-emitting end face 9 as a function of the end-face protecting film, sometimes it is required to change the reflection factor of the end-face protecting film through formation of a multi-layer film in order to improve the noise characteristic of an LD. Thus, it is important to secure a variety of materials for the multi-layer film.

The formation of the end-face protecting film 20b on the light-emitting end face 9 of the laser diode chip was carried out according to the aforementioned electron beam (EB) vapor deposition. That is, the film of $Al_2O_3$, $TiO_2$ or $ZrO_2$ was formed to a predetermined thickness ($\lambda/2n$), and then the film of $SiO_2$ was formed to a thickness of 276 nm ($\lambda/2n$). Thereafter, similarly as in the case of the above-described device in which the end-face protecting film is of a single layer structure, the device was assembled; that is, the resin-sealed laser diode device was formed. Those devices thus formed were subjected to a reliability test. In this case, only a heat cycle test was given to them (under the same conditions as those in the heat-cycle test given to the device in which the end-face protecting film is of a single layer structure) because interfacial separation in the boundary between the end-face protecting film and the end-face breakage preventing layer occurs most significantly in the heat cycle test. The results of test are as indicated in the following Table 7. The evaluation references are the same as those in the above-described reliability test (the end-face protecting film being of a single layer structure).

TABLE 7

| Sample No. | End-face protecting film material (thickness :nm) | Defect item | Number of heat cycles | | | |
|---|---|---|---|---|---|---|
| | | | 100 | 200 | 300 | 400 |
| 1 | $Al_2O_3/SiO_2$ (250/276) | FEP defect (%) | 0 | 0 | 0 | 0 |
| | | Defect other than FEP (%) | 0 | 0 | 0 | 0 |
| 2 | $TiO_2/SiO_2$ (182/276) | FEP defect (%) | 0 | 0 | 0 | 0 |
| | | Defect other than FEP (%) | 0 | 0 | 0 | 0 |
| 3 | $ZrO_2/SiO_2$ (203/276) | FEP defect (%) | 0 | 0 | 0 | 0 |
| | | Defect other than FEP (%) | 0 | 0 | 0 | 0 |

Figure 7:
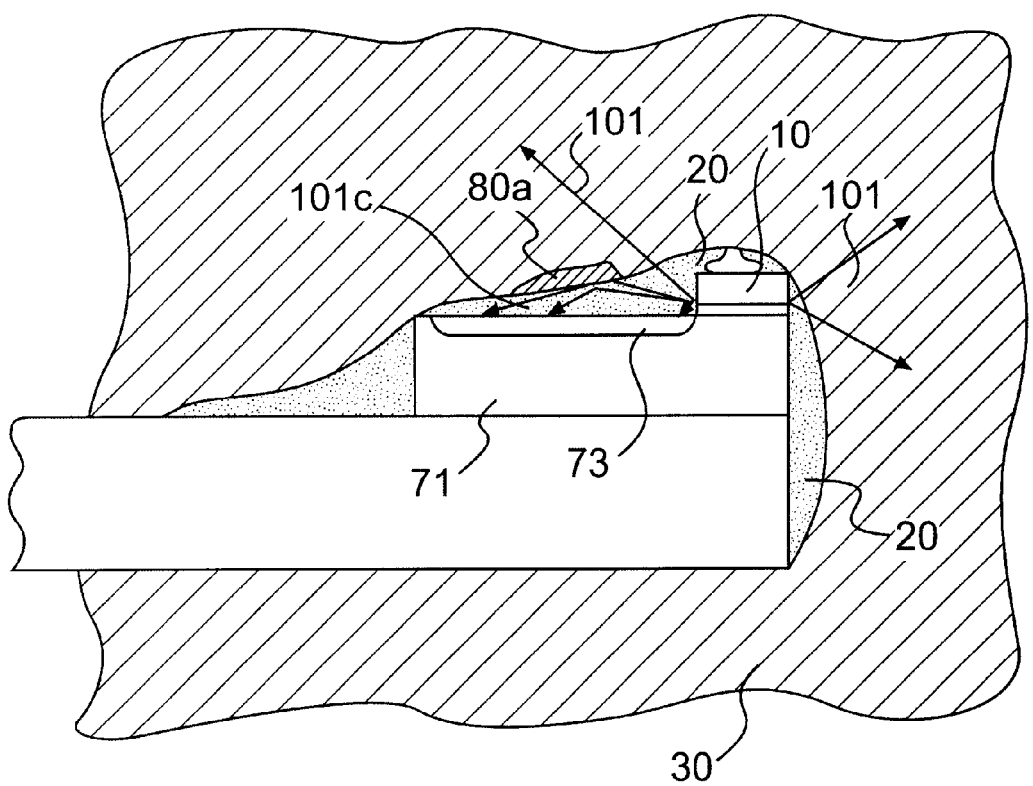
FIG. 7 is a sectional view showing separations in the interface between an end-face breakage preventing layer and a sealing resin in the resin-sealed laser diode device which is deteriorated.

As is seen from the results of test indicated in FIG. 7, when the material of the outermost surface of the end-face protecting film is made of silicon dioxide, the difficulty can be completely eliminated that, in the case where the end-face protecting film is of $Al_2O_3$, $TiO_2$ or $ZrO_2$, the far field pattern (FFP) is frequently liable to be unsatisfactory. This is probably because, as was described with reference to the device in which the end-face protecting layer is of a single layer structure, both the dimethyl polysiloxane which is an essential component of the rubber-like organic silicone resin of the end-face breakage preventing layer, and the $SiO_2$ component of the end-face protecting film have Si—O coupling in the skeleton, and the chemical coupling, which is generated in adhesion of the end-face breakage preventing layer to the end-face protecting film, advances effectively to provide a high adhesion strength.

Thus, in the cases where a variety of multi-layer films are employed as the end-face protecting film, the resulting devices are improved in reliability and in service life by forming the surface of the end-face protecting film with silicon dioxide. In the above-described examples, the film thickness of $SiO_2$ is 276 nm ($\lambda/2n$); however, it goes without saying that the same effect is obtained even if the thickness is made small than or larger than that value.

As was described above, in the resin-sealed laser diode device which comprises: the laser diode chip having the front and rear light-emitting end faces through which a laser beam from the active layer are emitted forwardly and backwardly; the end-face protecting films protecting the light-emitting end faces; the lead frame supporting the chip through the supporting substrate; the sealing resin sealingly isolating the chip from the outside air; and the end-face breakage preventing film of organic silicone resin low in the absorption coefficient to the band of wavelengths of the laser beam, for preventing the sealing resin near the light-emitting end faces from being damaged by the laser beam, the organic silicone resin is a thermosetting silicone resin which essentially contains rubber-like dimethyl polysiloxane, and the end-face breakage preventing layer has a thickness of at least 50 μm on the side of the front light-emitting end face on the extension of the surface of the active layer of the chip. The device thus designed is less in the optical damage to the sealing resin; that is, the device is greatly increased in service life.

In the device, the supporting substrate of the laser diode chip has the light receiving surface of a photo-diode which is in parallel with the surface of the active layer of the laser diode chip and monitors the laser beam at the rear light emitting side, and the laser diode chip is fixedly mounted on the lead frame with the front light-emitting end face held flush with the end face of the supporting substrate. In the device thus designed, the end-face breakage preventing layer on the side of the rear light-emitting end-face of the chip is also large in thickness, which eliminates the interfacial separation of the resin which adversely affects the monitor current value, thus contributing to the lengthening of the service life of the device.

Furthermore, in the device, the laser diode chip is fixedly mounted on the lead frame being shifted inwardly from the end of the lead frame to the extent that a laser beam emitted through the front light-emitting end face of the chip is not substantially blocked by the lead frame, and the position of the chip thus mounted is defined by the following expression:

$$0 < X < L \cot(\theta_v/2)$$

where X is the distance between the laser diode chip and the end of the lead frame, L is the distance between the lead frame and the active layer, and $\theta_v$ is the full width angle at half maximum, in the vertical emission direction, of the laser beam. Thus, in the device, the laser beam is not blocked by the lead frame, and, on the side of the front light-emitting end-face of the chip, the end-face breakage preventing layer can be readily increased in thickness. That is, the device can be increased in life time with ease.

Moreover, in the device, at least the surface of the end-face protecting film which is in contact with the rubber-like organic silicone resin essentially contains $SiO_2$, which increases the strength of adhesion of the end-face protecting film to the end-face breakage preventing layer, thus completely preventing the formation of the unacceptable far field pattern (FFP). Thus, the resultant resin-sealed laser diode device is improved in reliability and increased in service life.

What is claimed is:

1. A resin-sealed laser diode device, comprising:
   a laser diode chip having front and rear light-emitting end faces through which a laser beam from an active layer is emitted forwardly and backwardly;
   end-face protecting films protecting said light-emitting end faces;
   a lead frame supporting said chip through a supporting substrate;
   a sealing resin sealingly isolating said chip from outside air; and
   an end-face breakage preventing film of organic silicone resin low in an absorption coefficient to a band of wavelengths of said laser beam, for preventing said sealing resin near said light-emitting end faces from being damaged by said laser beam,
   wherein said organic silicone resin is like rubber and contains dimethyl polysiloxane, and wherein said end-face protecting films contain silicon dioxide at least at a surface in contact with said organic silicone resin.

2. A resin-sealed laser diode device as claimed in claim 1, wherein said rubber-like organic silicone resin is a thermo-setting resin.

3. A resin-sealed laser diode device as claimed in claim 1, wherein said end-face breakage preventing layer has a thickness of at least 50 μm at a side of said front light-emitting end face on an extended surface of said active layer of said chip.

4. A resin-sealed laser diode device as claimed in claim 1, wherein said supporting substrate of said laser diode chip has a light receiving surface of a photo-diode which is in parallel with a surface of said active layer of said laser diode chip, and monitors a laser beam emitted through said rear light-emitting end face.

5. A resin-sealed laser diode device as claimed in claim 4, wherein a surface of said end-face breakage preventing layer is curved outwardly with respect to said light receiving surface of said photo-diode.

6. A resin-sealed laser diode device as claimed in claim 1, wherein said laser diode chip is mounted on said lead frame while said chip is fixed to said supporting substrate so that said front light-emitting end face is held flush with an end face of said supporting substrate.

7. A resin-sealed laser diode device, comprising:
   a laser diode chip having front and rear light-emitting end faces through which a laser beam from an active layer is emitted forwardly and backwardly;
   end-face protecting films protecting said light-emitting end faces;
   a lead frame supporting said chip through a supporting substrate;
   a sealing resin sealingly isolating said chip from outside air; and
   an end-face breakage preventing film of organic silicone resin low in an absorption coefficient to a band of wavelengths of said laser beam, for preventing said sealing resin near said light-emitting end faces from being damaged by said laser beam,
   wherein said organic silicone resin is like rubber and contains dimethyl polysiloxane, and
   wherein said laser diode chip is mounted on said lead frame being shifted inwardly from an end of said lead frame to the extent that a laser beam emitted through said front light-emitting end face of said chip is not substantially blocked by said lead frame.

8. A resin-sealed laser diode devices, comprising:
   a laser diode chip having front and rear light-emitting end faces through which a laser beam from an active layer is emitted forwardly and backwardly;
   end-face protecting films protecting said light-emitting end faces;
   a lead frame supporting said chip through a supporting substrate;
   a sealing resin sealingly isolating said chip from outside air; and
   an end-face breakage preventing film of organic silicone resin low in an absorption coefficient to a band of wavelengths of said laser beam, for preventing said sealing resin near said light-emitting end faces from being damaged by said laser beam,
   wherein said organic silicone resin is like rubber and contains dimethyl polysiloxane; and
   wherein a position of said laser diode chip mounted on said lead frame is defined by the following expression:

$$0 < X < L \cot(\theta_v/2)$$

where X is a distance between said laser diode chip and the end of said lead frame, L is a distance between said lead frame and said active layer, and $\theta_v$ is a full width angle at half maximum, in a vertical emission direction, of said laser beam.

* * * * *

UNITED STATES PATENT AND TRADEMARK OFFICE
CERTIFICATE OF CORRECTION

PATENT NO. : 6,784,511 B1
DATED : August 31, 2004
INVENTOR(S) : Kunihara et al.

It is certified that error appears in the above-identified patent and that said Letters Patent is hereby corrected as shown below:

Column 20,
Line 40, "devices," should read -- device, --.
Line 56, "polysiloxane;" should read -- polysiloxane, --.

Signed and Sealed this

Sixteenth Day of November, 2004

JON W. DUDAS
*Director of the United States Patent and Trademark Office*